(12) United States Patent
Schzukin (10) Patent No.: US 6,442,747 B1
(45) Date of Patent: Aug. 27, 2002

(54) METHOD OF SYNTHESIZING A CYCLE REDUNDANCY CODE GENERATOR CIRCUIT USING HARDWARE DESCRIPTION LANGUAGE

(75) Inventor: Golan Schzukin, Tel Aviv (IL)

(73) Assignee: 3Com Corporation, Santa Clara, CA (US)

( * ) Notice: Subject to any disclaimer, the term of this patent is extended or adjusted under 35 U.S.C. 154(b) by 0 days.

(21) Appl. No.: 09/568,775

(22) Filed: May 10, 2000

(51) Int. Cl.[7] .......................... G06F 17/50; G06F 17/10
(52) U.S. Cl. ......................................................... 716/18
(58) Field of Search .................................. 716/1, 2, 18

(56) References Cited

PUBLICATIONS

Nair et al., "A Symbol Based Algorithm for Hardware Implementation of Cyclic Redundancy Check (CRC)," IEEE, 1997, pp. 82–87.*

Sait et al., "VLSI Layout Generation of a Programmable CRC Chip," IEEE Trans. on Consumer Electronics, vol. 39, No. 4, Nov. 1993, pp. 911–916.*

AWK User Guide, MKS Inc., 1999; URL; http//www-.datafocus.com/docs/man1/awk.1.htm. No Page #s.

* cited by examiner

Primary Examiner—Matthew Smith
Assistant Examiner—Leigh Marie Garbowski
(74) Attorney, Agent, or Firm—Howard Zaretsky; Paul J. Sutton (57) ABSTRACT

A method of synthesizing a CRC generator circuit for generating optimized code written in a high level hardware description language such as VHDL. The hardware description language code for implementing a CRC generator circuit has significantly less delay and utilizes fewer gates than prior art CRC generator circuit synthesis techniques. The method is operative to generate VHDL code which is then used to synthesize the circuit. The method iteratively generates the remainder equations for a CRC generator given the generator polynomial. During each iteration of the software, duplicate terms in each remainder equation are eliminated. The number of iterations is equal to the number of data bits the CRC generator is to process during each clock cycle. Once all the duplicate terms in the remainder equations are removed, the equations are sorted, rebuilt and translated into hardware description language code such as VHDL. The resulting optimized code may then be synthesized.

14 Claims, 2 Drawing Sheets

METHOD OF SYNTHESIZING A CYCLE REDUNDANCY CODE GENERATOR CIRCUIT USING HARDWARE DESCRIPTION LANGUAGE

FIELD OF THE INVENTION

The present invention relates generally to Cyclic Redundancy Code (CRC) check circuits and more particularly relates to a method of optimally synthesizing a CRC check circuit having less delay and lower gate count.

BACKGROUND OF THE INVENTION

In digital data communication systems and other types of systems such as information storage and retrieval systems, memory subsystems, etc., errors may occur as a result of channel noise, interference, media defects or circuit failure. In order to provide reliable communications it is necessary to be able to detect transmission errors. Transmission errors may be detected using a cyclic redundancy code (CRC) check which is a technique in widespread use in binary communication systems to detect errors in communicated data.

In general CRCs are calculated by treating the data as the coefficients of a polynomial, dividing the data by another polynomial, and preserving the remainder. The data and CRC together make up a codeword that is then transmitted over the communication channel. At a receiving end of the channel a CRC is again calculated and compared to the original. A discrepancy between the two CRCs indicates the occurrence of a transmission error.

The data input to the CRC can be viewed as a sequence of binary bits or a sequence of multibit symbols. In general, a bit-oriented CRC is desirable if the expected errors comprise random bit errors and a symbol-oriented CRC is desirable if the expected errors comprise burst errors or random symbol errors.

The computation of a CRC word involves using arithmetic to divide an input block of data by a constant called a generator polynomial. The resultant quotient is discarded while the remainder (i.e. the CRC word) is appended to the original numeric binary value and then transmitted. Typically, CRC words are computed using a multiple section feedback shift register with exclusive-OR (XOR) logic elements between sections to perform the modulo-2 arithmetic calculations. Each bit is provided to the CRC register where it is shifted or circulated through the CRC computational algorithm (circulation referring to the movement of data through the CRC register). The CRC computational algorithms can be implemented in hardware or software. In many cases, a CRC calculation on 'N' data bits must be performed within the same clock cycle in order to keep up with very high data rates of transmission. When calculating a CRC function for N data bits in one clock cycle, however, the CRC function becomes much more complex and requires significantly more circuit real estate to implement. The larger sized circuit typically results in a much longer delay that can affect the maximum attainable clock speed for the data.

Therefore, there is a need for a mechanism of creating a CRC circuit implementation having a smaller area and lower delay that does not impede the transmission of high rate data.

SUMMARY OF THE INVENTION

The present invention solves the problems associated with the prior art by providing a method of synthesizing a CRC generator circuit. The method is operative to generate optimized code in a high level hardware description language such as VHDL. In an example embodiment, the invention generates Very High Level Hardware Description Language (VHDL) code for implementing a CRC generator circuit that has significantly less delay and utilizes fewer gates than prior art CRC generator circuit synthesis techniques. The method is operative to generate VHDL code that can then be used to synthesize the circuit. The code generated functions to significantly reduce the gate count and complexity of the resulting circuit as well as significantly reduce the delay.

The method of the invention, as implemented in an example software application described herein below, iteratively generates the remainder equations for a CRC generator given the generator polynomial. During each iteration of the software, the duplicate terms in each remainder equation are eliminated or replaced with zero (which achieves the same thing). Since the terms in a remainder equation are all XORed with each other, duplicate entries can be eliminated based on the fact that anything XORed with itself equals zero. In addition, anything XORed with zero is itself.

The number of iterations is equal to the number of data bits the CRC generator is to process during each clock cycle. Once all the duplicate terms in the remainder equations are removed, the equations are sorted, rebuilt and translated into hardware description language code such as VHDL. The resulting code is then synthesized. Examples of a 10 bit CRC generator processing 32 bits of data are presented. In one example, the synthesis results of a prior art CRC generator is presented without use of the optimized code generated by the method of the present invention. In a second example, the synthesis results of a CRC generator is presented that uses the optimized code generated by the method of the present invention. The results clearly indicate the advantages of the present invention in terms of significantly lower delay times, cell counts and faster run times for the synthesizer.

There is thus provided in accordance with the present invention a method of generating high level circuit description language code representing a cyclic redundancy (CRC) generator circuit, the CRC generator circuit adapted to implement a generator polynomial G(x), the method comprising the steps of generating remainder equations for all bits in the CRC generator in accordance with the generator polynomial G(x), calculating in an iterative fashion remainder equations for all bits in the CRC generator for the $k^{th}$ data bit by substitution based on the remainder equations for the k–1 data bit, counting the number of occurrences of each term in each remainder equation, removing all occurrences of any term that occurs twice in a remainder equation, repeating the steps of calculating, counting and removing for each of N data bits, generating high level circuit description language code corresponding to the final set of remainder equations and wherein N is a positive integer.

BRIEF DESCRIPTION OF THE DRAWINGS

The invention is herein described, by way of example only, with reference to the accompanying drawings, wherein.

DETAILED DESCRIPTION OF THE INVENTION

Detailed Description

The present invention provides a method of synthesizing a CRC generator circuit. In an example embodiment, the invention generates Very High Definition Language (VHDL) code for implementing a CRC generator circuit that has significantly less delay and utilizes fewer gates than prior art CRC generator circuit synthesis techniques. The method is operative to generate VHDL code that can then be used to synthesize the circuit. The code generated functions to significantly reduce the gate count and complexity of the resulting circuit as well as significantly reduce the delay.

A software application listing is provided that implements the method of the present invention in the AWK programming language commonly found on UNIX and LINUX computer operating system platforms. It is appreciated that one skilled in the programming arts may implement the method of the present invention in other computer languages as well without departing from the spirit and scope of the invention. It is not intended that the method be limited to the AWK implementation shown herein.

Figure 1:
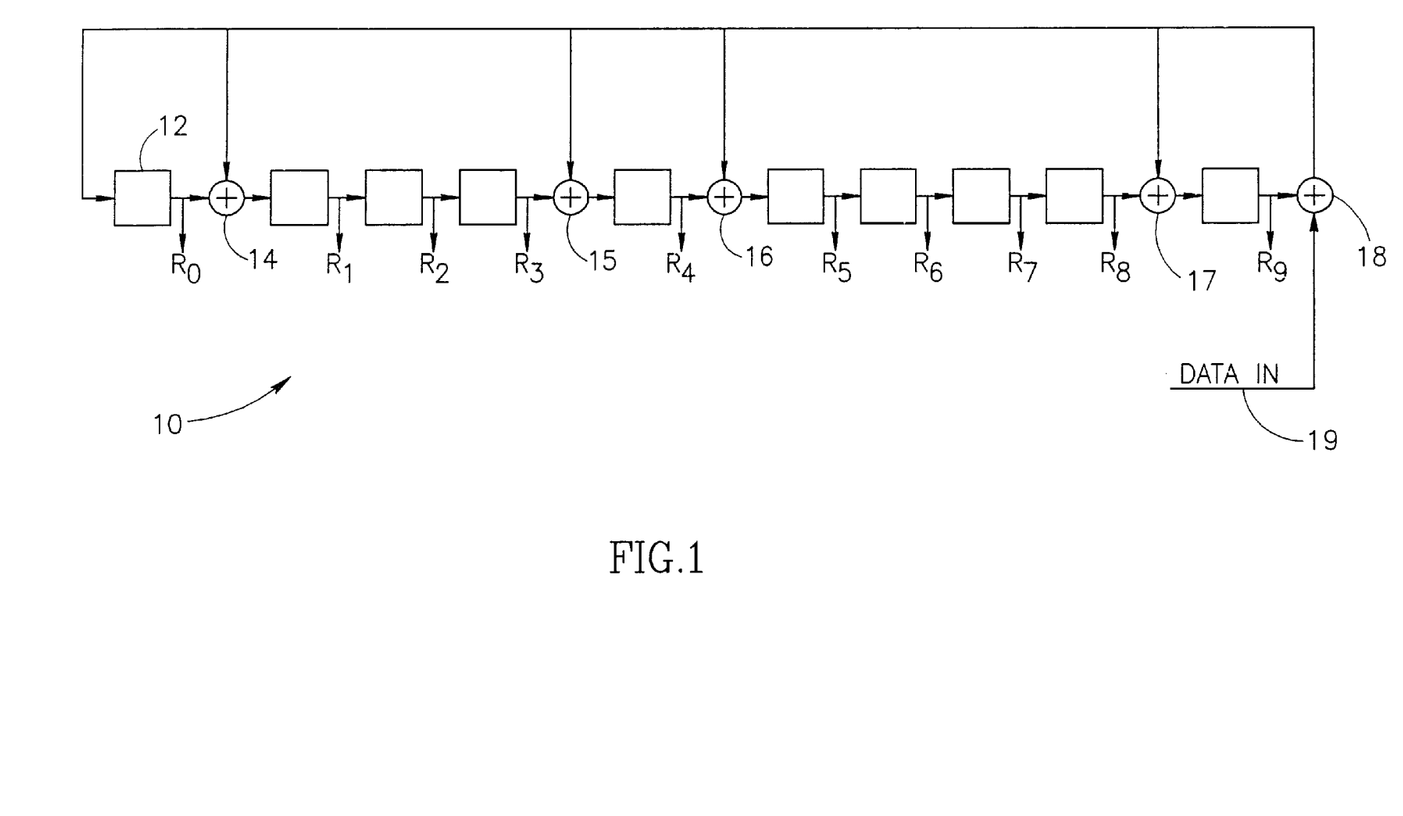
FIG. 1 is a block diagram illustrating an example cyclic redundancy code (CRC) check circuit.

To aid in understanding the principles of the present invention, the invention is described in the context of the example CRC generator shown in FIG. 1. It is appreciated that the method of the invention is applicable to CRC generators of any arbitrary length within the limitations of the particular computing platform and application software used to implement the method.

A block diagram illustrating an example cyclic redundancy code (CRC) check circuit is shown in FIG. 1. The CRC generator, generally referenced 10, is a 10-bit CRC generator comprising 10 registers 12 coupled in serial fashion. Several XOR gates are placed between selected registers for XORing the input data 19 with the output of a register. The CRC generator 10 is adapted to generate a 10-bit CRC value that can be used to detect an error that affects the serial data stream. The registers 12 of the circuit correspond to the remainder of a division operation on the polynomial and the data. Each of the ten remainder bits are labeled $R_0$ through $R_9$. Note that the CRC generator 10 is adapted to compute a CRC result on only a single data bit for each clock cycle. It can, however, be modified to generate the CRC for any arbitrary number of data bits by adding logic in accordance with the present invention.

The input data 19 is serially input to XOR gate 18 whose output is input to XOR gates 14, 15, 16, 17. The XOR gates in the circuit 10 are arranged so as to divide the input data by the chosen prime polynomial. In this example, the prime generating polynomial used is given below in Equation 1.

$$G(x)=x^{10}+x^9+x^5+x^4+x^1+1 \tag{1}$$

Each exponent of the generating polynomial is implemented as an XOR operation on the data and the current contents of the register. Note that the method of the present invention can be adapted to operate with any arbitrary polynomial of different order.

In operation, data is XORed with $R_9$ and the result is XORed with $R_8$, $R_4$, $R_3$ and $R_0$ so as to implement the generating polynomial given above. Different polynomials can be easily implemented using a different arrangement of XOR gates between the remainder registers. Data is clocked into the circuit in blocks, such as 16, 32 or 64 bit blocks. The contents of the remainder registers that remain after all the data is clocked in comprises the CRC check result. This CRC code word is then appended to the data and transmitted over the channel to the receiver.

At the receive side, the received data is processed by a CRC checker constructed using the exact same CRC polynomial as the transmitter. Using a first well known technique, the receiver passes the data without the received CRC through its own CRC machine in order to validate the CRC value. The CRC machine at the receiver is initialized to zero before the data is processed. After the data has passed through the CRC machine, the result is compared to the CRC received, i.e., the CRC calculated by the transmitter. The receiver has knowledge of the transmitter CRC result since it was appended to the tail of the transmission. If the two CRC values match, no error has occurred. If they do not match, it is an indication that an error has occurred.

Using a second well known technique, the CRC check can be performed in a slightly different manner based on the following principle. The CRC machine that receives as input a value that is equal to its current calculated value will always yield the same result, for a particular generating polynomial. This is used in practice when data with a CRC appended to it is input to a CRC generator. If no errors occurred, the CRC result is a constant. For a 32 bit CRC machine, using the well known Ethernet 32 bit CRC polynomial, for example, this result is the hex value 1CDF4421. This value is different for different generating polynomials. The result is different for different width CRC machines. This phenomena is the result of the division of the input by the CRC polynomial and is a well known property of CRC generators.

If the CRC value is located at the tail of the transmitted data, the CRC value calculated by the CRC generator at the end of the data transmission should be equal to the CRC value calculated by the transmitter. After the CRC machine processes the CRC value previously appended to the data, the CRC remainder should be equal to 0×1CDF4421, for the 32 bit Ethernet CRC polynomial. A result other than this indicates that an error has occurred.

CRC Synthesis Method of the Present Invention

Figure 2:
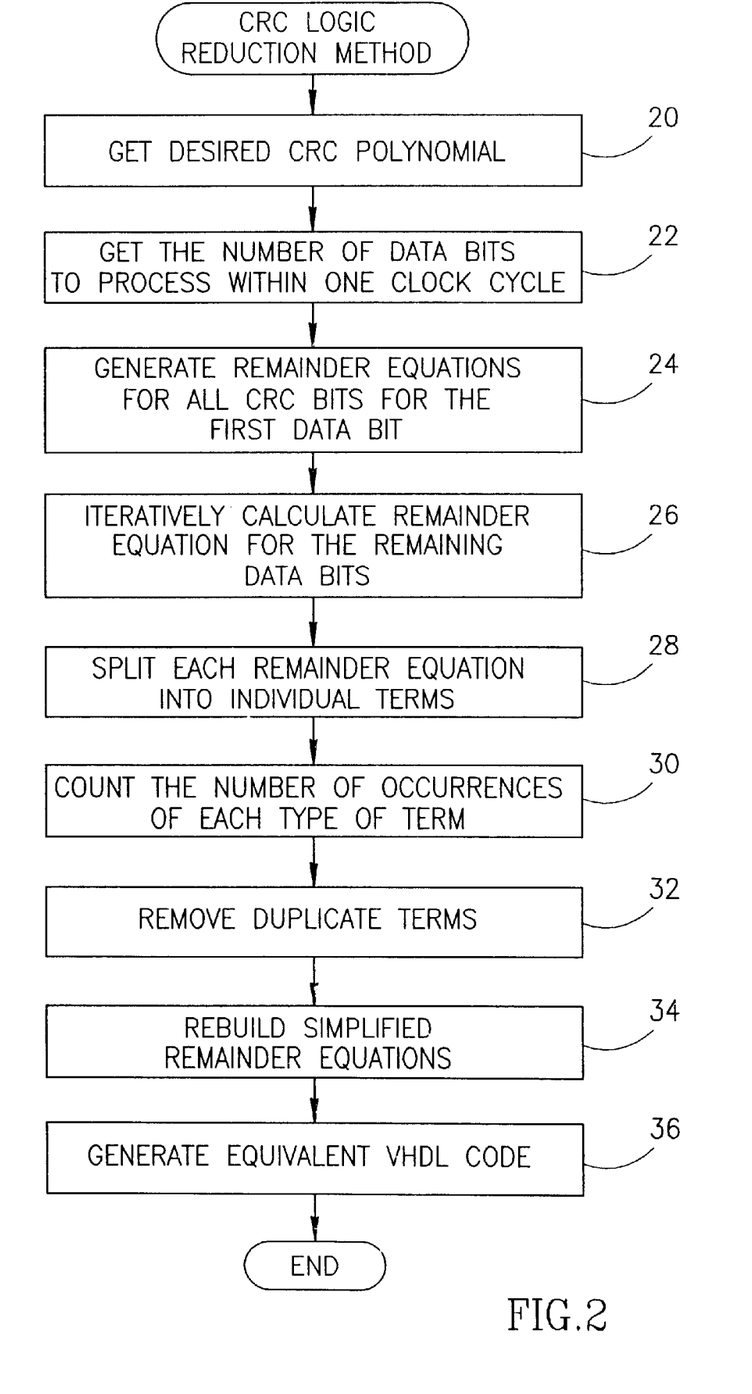
FIG. 2 is a method of generating a CRC check circuit having fewer gates and lower delay.

The synthesis method of the present invention will now be described in more detail. A method of optimally generating a CRC check circuit having fewer gates and lower delay is shown in FIG. 2. The method is adapted to generate high level circuit design code that is subsequently used as input to a synthesizer. The example method presented herein is adapted to generate VHDL code that is then input to a VHDL synthesizer such as the Synopsis synthesis platform. It is appreciated, however, that the method can be adapted to generate other types of high level circuit code as well without departing from the spirit and scope of the present invention.

In addition, the method is adapted to operate on blocks of data having a finite length. The number of bits in the data block is a parameter of the method. The method is operative to generate a hardware implementation that calculates the CRC result on 'N' data bits within the same clock cycle. To better illustrate the method of the invention, an example is presented herein below that operates on a data block three bits in length.

In general, the method is operative to generate a plurality of remainder equations, one for each bit in the CRC generator. Considering the 10-bit CRC generator example presented above, the method is operative to generate 10 remainder equations. The method cycles through each bit of the data and generates the equivalent equations that would be used to calculate the remainder bit for that particular input data bit. At each iteration the duplicate terms are removed since the XOR of something with itself is zero. Thus, after all iterations are complete, the resulting remainder equations are greatly simplified from what they would be without the invention. The results are then input to a synthesizer for realization as a plurality of gates.

With reference to FIG. 2, the user provides the desired CRC polynomial the CRC generator is to implement (step 20). Note that one skilled in the software arts may modify the software to handle the user provided polynomial programmatically or, alternatively, the polynomial may be hard coded into the software. In addition to the polynomial, the user also provides the software with the number of data bits to process within a single clock cycle (step 22).

In accordance with the polynomial, the remainder equations for all bits of the CRC generator are generated for the first input data bit (step 24). Here too, one skilled in the software arts may perform this programmatically or it may be hard coded in the software. Once the remainder equations for the first data bit are generated, the remainder equations for the remaining data bits are calculated iteratively (step 26).

During each iteration, the current remainder equation is split into the individual terms making up the equation (step 28). Note that terms making up an equation are ultimately XORed with each other by the CRC generator circuit. The number of occurrences of each term is then counted (step 30). Any term appearing an even number of times, i.e. two times, is removed (step 32). This is based on the principle that a term XORed with itself yields a result of zero. Thus, duplicate terms drop out of the equation since they do not effect the result.

Once all the duplicate terms are removed, the simplified equations are rebuilt and the process repeats for the next data bit (step 34). After the remainder equations are processed for all input data bits, the equivalent VHDL code is generated (step 36). The code is then synthesized using suitable software such as the Synopsis synthesis platform thus resulting in the realization of a CRC generator having significantly less delay and lower cell count.

Implementation in the AWK Programming Language

To illustrate the principles of the present invention, an implementation of the method of the present invention in the well known AWK programming language is presented below in Listing 1. The AWK language is a widely used file and text processing language built into the UNIX and LINUX operation systems. It is well suited to data manipulation and retrieval of information from text files.

In this example implementation, the polynomial presented above in Equation 1 is hard coded into the program. The remainder equations for the first data bit are also hard coded. The values for the CRC registers are represented by variables r0 through r9 which denote that values of the registers for bits 0 through 9 of the CRC generator. In addition, the first data bit is represented by d0, followed by the second data bit represented by d1 and so on. The number of data bits for which a CRC result is to be generated within one clock cycle is provided in the command line parameter 'times.' The 'xor' function is not explicitly expressed in the remainder equations, but is read into the equations by placing an XOR in between each term. For example, the equation for the ninth remainder bit is as follows $$r9 = r9 XOR r8 XOR d0$$

In addition, the high level circuit description language code generation portion of the software application is adapted to generate VHDL code for a block size of 32 bit data bits, i.e. the CRC generator generates a CRC result within a single clock cycle for 32 data bits.

Listing 1: Implementation of CRC Synthesis Method Using 'AWK' Programming Language

```
#!/usr/bin/nawk -f
#Usage: data_variable_gen_crc 10.awk times=<num><file name>
BEGIN {
#primepolynomial(level 10) G(x) = x^10 + x^9 + x^5 + x^4 + x^1 + 1
    r9 = "r9 r8 d0";
    r8 = "r7";
    r7 = "r6";
    r6 = "r5";
    r5 = "r9 r4 d0";
    r4 = "r9 r3 d0";
    r3 = "r2";
    r2 = "r1";
    r1 = "r9 r0 d0";
    r0 = "r9 d0"
}
END {
    for(k= 1;k<times;k++) {
        t[9] = r9 "    "r8"    d"k;
        t[8] = r7;
        t[7] = r6;
        t[6] = r5;
        t[5] = r9"    "r4"    d"k;
        t[4] = r3"    "r3"    d"k;
        t[3] = r2;
        t[2] = r1;
        t[1] = r9"    "r0"    d"k;
        t[0] =[r9"    "d"k;
#set new CRC equations (go over all the remainder equations)
        for(l = 9; l >= 0; l--) {
#str_tokens: the number of tokens in the equation.
#all token are split into an array inside v_temp_tokenms, after the split command
```

-continued

Listing 1: Implementation of CRC Synthesis Method Using 'AWK' Programming Language

```
            str_tokens = split(t[1] , v_temp_tokens);
            tr = "";
            td = "";
            to = "";
#go over all the tokens of the current equation.
            for (i = 1; i <= str_tokens; i++) {
#tmp 1: holds the current token.
                tmp 1 = v_temp_tokens[1] ;
#count occurrences of each token (variable)
#tmp_arr[token] : holds the number of times token appeared in the equation.
                if((tmp_arr[tmp1] = "") || (tmp_arr[tmp1] == 0)) {
                    tmp_arr[tmp 1] = 1;
                } else {
                    tmp_arr[tmp 1] = tmp_arr[tmp 1 ] + 1;
                }
            }
#go again over all the tokens of the current equation,
#and build the equation again, removing duplications.
        for (i = 1; i <=str_tokens; i++) {
#tmp 1: holds the current token.
            tmp1 = v_temp_tokens[i] ;
#replace tokens that appear 2 times, with '0'.
            if(tmp_arr[tmp1] == 2) {
#x XOR x = 0
                tmp_arr[tmp 1] = 0;
                to = "0";
            } else if(tmp_arr[tmp1] == 1) {
#add x to data variables or to old_crc variables or to zero list.
                tmp_arr[tmp 1] = 0;
                if (tmp 0~"d") {
                    td = td""tmp1;
                } else if(tmp1~"r") {
                    tr= tr ""tmp1;
                } else if(tmp1~"0") {
                    to = "0";
                } else {
                    printf("*****error1**********\n");
                }
            } else if(tmp_arr[tmp1] != 0) {
                printf("*****error2**********\n");
            }
        }
#create equation again - concat list (new_data old_crc, zero)
            tmp_r[1] = tr td to;
        }
        r9 = tmp_r[9];
        r8 = tmp_r[8];
        r7 = tmp_r[7];
        r6 = tmp_r[6];
        r5 = tmp_r[5];
        r4 = tmp_r[4];
        r3 = tmp_r[3];
        r2 = tmp_r[2];
        r1 = tmp_r[1];
        r0 = tmp_r[0];
    }
#sort and print results in VHDL format.
    tmp_r[9] = r9;
    tmp_r[8] = r8;
    tmp_r[7] = r7;
    tmp_r[6] = r6;
    tmp_r[5] = r5;
    tmp_r[4] = r4;
    tmp_r[3] = r3;
    tmp_r[2] = r2;
    tmp_r[1] = r1;
    tmp_r[0] = r0;
    printf("\n");
    printf("THE VHDL Remainder EQUATION (for %d data bits in one clock)\n", times);
#loop on number of CRC bits
    for(k = 9;k >= 0;k--) {
        v_x1 =tmp_r[k] ;
        str_tokens = split(v_x1, v_x1_tokens);
        printf("crc 10__/%02dcomb(%01d) <=\n   ",times, k);
#print and sort equations (d31 d30....d1 d0
#           r9 r8 ... r0
#               0
```

Listing 1: Implementation of CRC Synthesis Method Using 'AWK' Programming Language

```
            for (j = 31;j >= 0;j--) {
                str_var = "d"j;
                found = 0;
                for (i = 1; i <= str_tokens; i++) {
                    tmp1 = v_x1_tokens[i];
                        if(tmp1 == str_var) {
                            found = 1;
                        }
                }
                if(found == 1) {
                    printf("new_data(%02d) XOR ",j);
                } else {
                    printf("'0'       XOR ",j);
                }
                if(j%4 == 0) {
                    printf("\n    ");
                }
            }
            printf("\n                ");
            for (j = 9;j >= 0;j--) {
                str_var= "r"j;
                found = 0;
                for (i = 1; i <= str_tokens; i++) {
                    tmp1 = v_x1_tokens[i];
                    if(tmp1 = str_var) {
                        found = 1;
                    }
                }
                if(found == 1) {
                    printf("old_crc(%02d) XOR ",j);
                } else {
                    printf("'0'       XOR ",j);
                    }
                if(j%4 ==0) {
                    printf("\n    ");
                }
            }
            printf("'0;\n\n");
    }
}
```

3-Bit Illustrative Example

To illustrate the principles of the present invention, the AWK program in Listing 1 is run for the 10-bit CRC generator for N=3 data bits. Thus, the software is adapted to generate high level circuit description code wherein a CRC result is generated within a single clock cycle. To generate the results in Listing 2, standard 'printf' statements were added to the AWK program in Listing 1 to output the contents of the remainder equations before and after removal of duplicate terms for each iteration of the input data bit.

Listing 2: Run Results for 3 data bits and 10 bit CRC generator

Remainder Equations: Data Bit 0 r9 = r9 r8 d0
r8 = r7
r7 = r6
r6 = r5
rr = r4 d0
r4 = r9 r3 d0
r3 = r2
r2 = r1
r1 = r9 r0 d0
r0 = 9 d0

Listing 2: Run Results for 3 data bits and 10 bit CRC generator

Remainder Equations: Data Bit 1 -Before Removal of Duplicate Terms t[9] = r9 r8 d0      r7      d1
t[8] = r6
t[7] = r5
t[6] = r4 d0
t[5] = r8 d0      r3 d0      d1
t[4] = r8 d0      r2      d1
t[3] = r1
t[2] = r9 r0 d0
t[1] = r0 r8 d0      d0      d1
t[O] = r9 r8 d0      d1

Remainder Equations: Data Bit 1 -After Removal of Duplicate Terms r9 = ro r8 r7 d0 d1
r8 = r6
r7 = r5
r6 = r9 r4 d0
r5 = r8 r3 d1 0
r4 = r0 r8 r2 d0 d1
r3 = r1
r2 = r9 r0 d0
r1 = r8 d1 0
r0 = r9 r8 d0 d1

-continued

Listing 2: Run Results for 3 data bits and 10 bit CRC generator

Remainder Equations: Data Bit 2-Before Removal of Duplicate Terms t[9] = r9 r8 r7 d0 d1   r6   d2
t[8] = r5
t[7] = r9 r4 d0
t[6] = r8 r3 d1 0
t[5] = r9 r8 r7 d0 d1   r9 r8 r2 d0 d1   d2
t[4] = r9 r8 r7 d0 d1   r1   d2
t[3] = r9 r0 d0
t[2] = r8 d1 0
t[1] = r9 r8 r7 d0 d1   r9 r8 d0 d1   d2
t[0] = r9 r8 r7 d0 d1   d2

Remainder Equations: Data Bit 2-After Removal of Duplicate Terms r9 = r9 r8 r7 r6 d0 d1 d2
r8 = r5
r7 = r9 r4 d0
r6 = r8 r3 d1 0
r5 = r7 r2 d2 0
r4 = r9 r8 r7 r1 d0 d1 d2
r3 = r9 r0 d0
r2 = r8 d1 0
r1 = r7 d2 0
r0 = r9 r8 r7 d0 d1 d2

VHDL Remainder Equations (for 3 data bits within one clock)

crc10_03comb(9) <=
'0'   XOR '0'   XOR '0'   XOR '0'   XOR
'0'   XOR '0'   XOR '0'   XOR '0'   XOR
'0'   XOR '0'   XOR '0'   XOR '0'   XOR
'0'   XOR '0'   XOR '0'   XOR '0'   XOR
'0'   XOR '0'   XOR '0'   XOR '0'   XOR
'0'   XOR '0'   XOR '0'   XOR '0'   XOR
'0'   XOR new_data(02) XOR new_data(01) XOR new_data(0) XOR
old_crc(09) XOR old_crc(08) XOR old_crc(07) XOR old_crc(06) XOR
'0'   XOR '0'   XOR '0'   XOR '0'   XOR
'0'   XOR '0'   XOR '0';
crc10_03comb(8) <=
'0'   XOR '0'   XOR '0'   XOR '0'   XOR
'0'   XOR '0'   XOR '0'   XOR '0'   XOR
'0'   XOR '0'   XOR '0'   XOR '0'   XOR
'0'   XOR '0'   XOR '0'   XOR '0'   XOR
'0'   XOR '0'   XOR '0'   XOR '0'   XOR
'0'   XOR '0'   XOR '0'   XOR '0'   XOR
'0'   XOR '0'   XOR '0'   XOR '0'   XOR
old_crc(05) XOR '0'   XOR '0'   XOR '0'   XOR
'0'   XOR '0'   XOR '0';
crc10_03comb(7) <=
'0'   XOR '0'   XOR '0'   XOR '0'   XOR
'0'   XOR '0'   XOR '0'   XOR '0'   XOR
'0'   XOR '0'   XOR '0'   XOR '0'   XOR
'0'   XOR '0'   XOR '0'   XOR '0'   XOR
'0'   XOR '0'   XOR '0'   XOR '0'   XOR
'0'   XOR '0'   XOR '0'   XOR '0'   XOR
old_crc(09) XOR '0'   XOR '0'   XOR '0'   XOR
'0'   XOR old_crc(04) XOR '0'   XOR '0'   XOR
'0'   XOR '0'   XOR '0';
crc10_03comb(6) <=
'0'   XOR '0'   XOR '0'   XOR '0'   XOR
'0'   XOR '0'   XOR '0'   XOR '0'   XOR
'0'   XOR '0'   XOR '0'   XOR '0'   XOR
'0'   XOR '0'   XOR '0'   XOR '0'   XOR
'0'   XOR '0'   XOR '0'   XOR '0'   XOR
'0'   XOR '0'   XOR new_dat(01) XIR '0'   XOR
'0'   XOR old_crc(08) XOR '0'   XOR '0'   XOR
'0'   XOR '0'   XOR old_crc(03)   XOR '0'   XOR
'0'   XOR '0'   XOR '0';
crc10_03comb(5) <=
'0'   XOR '0'   XOR '0'   XOR '0'   XOR
'0'   XOR '0'   XOR '0'   XOR '0'   XOR
'0'   XOR '0'   XOR '0'   XOR '0'   XOR -continued Listing 2: Run Results for 3 data bits and 10 bit CRC generator '0'   XOR '0'   XOR '0'   XOR '0'   XOR
'0'   XOR '0'   XOR '0'   XOR '0'   XOR
'0'   XOR '0'   XOR '0'   XOR '0'   XOR
'0'   XOR '0'   XOR '0'   XOR '0'   XOR
'0'   XOR new_data(02) XOR '0'   XOR '0'   XOR
'0'   XOR '0'   XOR old_crc(07) XOR '0'   XOR
'0'   XOR '0'   XOR '0'   XOR odd_crc(02) XOR
'0'   XOR '0'   XOR '0';
crc10_03comb(4) <=
'0'   XOR '0'   XOR '0'   XOR '0'   XOR
'0'   XOR '0'   XOR '0'   XOR '0'   XOR
'0'   XOR '0'   XOR '0'   XOR '0'   XOR
'0'   XOR '0'   XOR '0'   XOR '0'   XOR
'0'   XOR '0'   XOR '0'   XOR '0'   XOR
'0'   XOR '0'   XOR '0'   XOR '0'   XOR
'0'   XOR '0'   XOR '0'   XOR '0'   XOR
'0'   XOR new_data(02) XOR new_data(01) XOR new_data(00) XOR
old_crc(09) XOR old_crc(08) XOR old_crc(07) XOR '0'   XOR
'0'   XOR '0'   XOR '0'   XOR '0'   XOR
old_crc(01) XOR '0'   XOR '0';
crc10_03comb(3) <=
'0'   XOR '0'   XOR '0'   XOR '0'   XOR
'0'   XOR '0'   XOR '0'   XOR '0'   XOR
'0'   XOR '0'   XOR '0'   XOR '0'   XOR
'0'   XOR '0'   XOR '0'   XOR '0'   XOR
'0'   XOR '0'   XOR '0'   XOR '0'   XOR
'0'   XOR '0'   XOR '0'   XOR '0'   XOR
'0'   XOR '0'   XOR '0'   XOR '0'   XOR
'0'   XOR '0' XOR '0'   XOR new_data(00) XOR
old_crc(09) XOR '0'   XOR '0'   XOR '0'   XOR
'0'   XOR '0'   XOR '0'   XOR '0'   XOR
'0'   XOR old_crc(00) XOR '0';
crc10_03comb(2) <=
'0'   XOR '0'   XOR '0'   XOR '0'   XOR
'0'   XOR '0'   XOR '0'   XOR '0'   XOR
'0'   XOR '0'   XOR '0'   XOR '0'   XOR
'0'   XOR '0'   XOR '0'   XOR '0'   XOR
'0'   XOR '0'   XOR '0'   XOR '0'   XOR
'0'   XOR '0'   XOR '0'   XOR '0'   XOR
'0'   XOR '0'   XOR new_data(01) XOR '0'   XOR
'0'   XOR old_crc(08) XOR '0'   XOR '0'   XOR
'0'   XOR '0'   XOR '0';
crc10_03comb(1) <=
'0'   XOR '0'   XOR '0'   XOR '0'   XOR
'0'   XOR '0'   XOR '0'   XOR '0'   XOR
'0'   XOR '0'   XOR '0'   XOR '0'   XOR
'0'   XOR '0'   XOR '0'   XOR '0'   XOR
'0'   XOR '0'   XOR '0'   XOR '0'   XOR
'0'   XOR '0'   XOR '0'   XOR '0'   XOR
'0'   XOR new_data(02) XOR '0'   XOR '0'   XOR
'0'   XOR '0'   XOR old_crc(07) XOR '0'   XOR
'0'   XOR '0'   XOR '0';
crc10_03comb(0) <=
'0'   XOR '0'   XOR '0'   XOR '0'   XOR
'0'   XOR '0'   XOR '0'   XOR '0'   XOR
'0'   XOR '0'   XOR '0'   XOR '0'   XOR
'0'   XOR '0'   XOR '0'   XOR '0'   XOR
'0'   XOR '0'   XOR '0'   XOR '0'   XOR
'0'   XOR new_data(02) XOR new_data(01) XOR new_data(00) XOR
old_crc(09) XOR old_crc(08) XOR old_crc(07) XOR '0'   XOR
'0'   XOR '0'   XOR '0';

Note that some of the remainder equations generated by the program before VHDL code is generated contain a zero. The zero indicates that one or more duplicate terms were removed. This does not change the final value since anything XORed with zero is itself. Note also that the VHDL remainder equations are represented by the array 'crc10_03comb' wherein each remainder equation is stored as an element of the array. For example, the remainder equation for the $7^{th}$ bit is stored in crc10_03comb(7).

Prior Art VHDL Implementation of a CRC Generator Using 32 Data Bits

To illustrate the advantages and benefits of the present invention, a prior art VHDL code implementation of a 10 bit CRC generator that does not utilize the optimization method of the present invention is presented below in Listing 3. The CRC generator implemented operates on 32 bits of data at a time within a single clock cycle. The code is written in a straightforward manner and was synthesized using the Synopsys synthesis platform.

Listing 3: Prior Art VHDL Code Implementation of a 10-bit CRC Generator

```
--
-- 10-bit CRC generator, using 32 bit data blocks
-- Generating polynomial is G(x) = x¹⁰ + x⁹ + x⁵ + x⁴ + x¹ + 1
--
library ieee;
use ieee.std_logic_1164 all
use ieee.std_logic_unsigned.all;
use ieee.std_logic_arith.all
entity crc10_chk is
port (
-- Global signals
    grstn       : in std_logic;
    sclk        : in std_logic;
--
    start       : in std_logic;
    new_data    : in std_logic_vector(31 downto 0);
--
    crc10_ok    : out std_logic
    );
end crc10_chk;
architecture arc of crc10_chk is
signal crc 10_32comb    : std_logic_vector(9 downto 0);
signal old_crc          : std_logic_vector(9 downto 0);
signal in_cell_counter: std_logic_vector(3 downto 0);
begin
set_crc_res : process(sclk, grstn)
begin
    if(grstn = '0') then
        old_crc <= (others => '0'0;
        crc10_ok <= '0';
    elsif((sclk'event) AND (sclk = '1')) then
        if (in_cell_counter = "0000") then
            old_crc <= (others ->'0');
        else
            old_crc <= crc10_32comb;
        end if;
        if(in_cell_counter = "1101") then
            if(old_crc = "0000000000") then
                crc10_ok <= "1';
            else
                crc10_ok <= '0';
            end if;
        else
            crc10 ok <= '0';
        end if;
    end if;
end process set_crc_res;
cell_counter_prc : process(sclk, grstn)
begin
    if(grstn = '0') then
        in_cell_counter <= (others => '0');
    elsif((sclk'event) AND (sclk = '1')) then
        if(start = '1') then
            in_cell_counter <= "0001";
        elsif (in_cell_counter = "1101") then
            in_cell_counter <= "0000";
        elsif (in_cell_counter /= "0000") then
            in_cell_counter <= in cell_counter + '1';
        end if;
    end if;
end process cell_counter_prc;
calc_crc : process(old_crc, new_data)
--prime polynomial(level 10) G(x) = x¹⁰ + x⁹ + x⁵ + x⁴ + x¹ + 1
    constant GX : std_logic_vector (10 downto 0) := "11000110011";
    variable res        : std_logic_vector (9 downto 0);
    variable feedback   : std_logic;
```

-continued

Listing 3: Prior Art VHDL Code Implementation of a 10-bit CRC Generator

```
--
-- 10-bit CRC generator, using 32 bit data blocks
-- Generating polynomial is G(x) = x^10 + x^9 + x^5 + x^4 + x^1 + 1
--
library ieee;
use ieee.std_logic_1164 all
use ieee.std_logic_unsigned.all;
use ieee.std_logic_arith.all
entity crc10_chk is
port (
-- Global signals
begin
    res := old_crc;
    for j in 0 to 3 loop -- number of bytes
-- calc new CRC (using the next byte of data).
        for i in 0 to 7 loop -- loop of each byte
            feedback := new_data(j*8+i) XOR res(9);
            for k in 8 downto 0 loop -- loop on CRC bits
                res(k+1) := res(k) XOR (GX(k+1) AND feedback);
            end loop;
            res(0) := feedback;
        end loop;
    end loop;
    crc10_32comb <= res;
end process calc_crc;
end arc;
```

The CRC generator circuit as expressed in the prior art VHDL code shown in Listing 3 above was synthesized using Synopsys synthesis platform. The circuit utilizes a 10 ns clock and has the time constraint of generating a CRC result on 32 bits of input data within a single clock cycle, i.e. within 10 ns.

It is noted that the realization of the prior art circuit of Listing 3 as synthesized by the Synopsys synthesis platform, is not sufficiently fast enough to meet the time requirements imposed by a 10 ns clock rate. The time delay of the circuit realization is 12.4 ns beyond the requirements. In addition, the circuit consumes a total cell area of 917 cell units and requires approximately 6½ minutes to run from start of syntheses to completion.

VHDL Implementation of a CRC Generator Using 32 Data Bits Using the Synthesis Method of the Present Invention In contrast to the VHDL implementation of the CRC generator of the prior art, Listing 4 below presents the VHDL code of a CRC generator constructed using the synthesis method of the present invention. Similar to the prior art example, the CRC generator implemented is operative to generate a CRC result for 32 data bits within a single clock cycle. The program of Listing 1 was used to generate the 'crc10_32comb' array using the same 10-bit CRC generating polynomial. The number of data bits N was set to 32. The VHDL code was synthesized using the Synopsys synthesis platform.

Listing 4: Optimized VHDL Implementation of a 10-bit CRC Generator Using 32 Data Bits

```
--
-- crc10_chk_new - Check crc10 block, 32 bits at a time
-- Generating polynomial is: G(x) = x^10 + x^9 + x^5 + x^4 + x^1 + 1
--
library ieee;
use ieee.std_logic_1164.all;
use ieee.std_logic_unsigned.all;
use ieee.std_logic_arith.all
entity crc10_chk_new is
port (
-- Global signals
    grstn    : in std_logic;
    sclk     : in std_logic;
--
    start    : in std_logic;
    new_data     : in std_logic_vector(31 downto 0);
--
    crc10_ok     : out std_logic
    );
endcrc10_chk_new;
architecture arc of crc 10_chk_new is
signal crc 10_32comb   : std_logic_vector(9 downto 0);
signal old_crc  : std_logic_vector(9 downto 0);
signal in_cell_counter: std_logic_vector(3 downto 0);
```

-continued

Listing 4: Optimized VHDL Implementation of a 10-bit CRC Generator Using 32 Data Bits

```
begin
set_crc_res : process(sclk, grstn)
begin
    if(grstn = '0') then
        old_crc <= (others =>'0');
        crc10_ok <= '0';
    elsif((sclk'event) AND (sctk = '1')) then
        if (in_cell_counter = "0000") then
            old_crc <= (others => '0');
        else
            old_crc<=crc10_32comb;
        endif;
        if(in_cell_counter = "1101") then
            if(old_crc = "0000000000") then
                crc10_ok <= '1';
            else
                crc10_ok <= '0';
            end if;
        else
            crc10 ok <= '0';
        end if
    end if;
end process set_crc_res;
cell_counter_prc : process(sclk, grstn)
begin
    if(grstn = '0') then
        in_cell_counter <= (others => '0');
    elsif ((sclk'event) AND (sclk = '1')) then
        if(start = '1') then
            in_cell_counter <= "0001";
        etsif (in_cell_counter = "1101") then
            in_cell_counter <= "0000";
        elsif (in_cell_counter /= "0000") then
            in_cell_counter <= in cell_counter + '1';
        end if;
    end if;
end process cell_counter_prc;
crc10_32comb(9) <=
    new_data(31) XOR new_data(30) XOR new_data(29) XOR new_data(28) XOR
    '0'       XOR '0'       XOR '0'       XOR '0'       XOR
    new_data(23) XOR '0'       XOR '0'       XOR '0'       XOR
    '0'       XOR '0'       XOR new_data(17) XOR new_data(16) XOR
    new_data(15) XOR '0'       XOR new_data(13) XOR '0'       XOR
    '0'       XOR '0'       XOR new_data(09) XOR new_data(08) XOR
    '0'       XOR '0'       XOR new_data(05) XOR new_data(04) XOR
    '0'       XOR new_data(02) XOR new_data(01) XOR new_data(00) XOR
    old_crc(09) XOR old_crc(08) XOR old_crc(07) XOR '0'       XOR
    old_crc(05) XOR old_crc(04) XOR '0'       XOR '0'       XOR
    old_crc(01) XOR old_crc(00) XOR '0';
crc10_32comb(8) <=
    '0'       XOR '0'       XOR '0'       XOR new_data(28) XOR
    '0'       XOR '0'       XOR '0'       XOR new_data(24) XOR
    new_data(23) XOR '0'       XOR '0'       XOR '0'       XOR
    '0'       XOR new_data(18) XOR '0'       XOR '0'       XOR
    new_data(15) XOR new_data(14) XOR new_data(13) XOR '0'       XOR
    '0'       XOR new_data(10) XOR '0'       XOR new_data(08) XOR
    '0'       XOR new_data(06) XOR '0'       XOR new_data(04) XOR
    new_data(03) XOR '0'       XOR '0'       XOR '0'       XOR
    '0'       XOR '0'       XOR '0'       XOR old_crc(06) XOR
    old_crc(05) XOR '0'       XOR old_crc(03) XOR '0'       XOR
    old_crc(01) XOR '0'       XOR '0';
crc10_32comb(7) <=
    '0'       XOR '0'       XOR new_data(29) XOR '0'       XOR
    '0'       XOR '0'       XOR new_data(25) XOR new_data(24) XOR
    '0'       XOR '0'       XOR '0'       XOR '0'       XOR
    new_data(19) XOR '0'       XOR '0'       XOR new_data(16) XOR
    new_data(15) XOR new_data(14) XOR '0'       XOR '0'       XOR
    new_data(11) XOR '0'       XOR new_data(09) XOR '0'       XOR
    new_data(07) XOR '0'       XOR new_data(05) XOR new_data(04) XOR
    '0'       XOR '0'       XOR '0'       XOR '0'       XOR
    '0'       XOR '0'       XOR '0'       XOR '0'       XOR
    old_crc(05) XOR old_crc(04) XOR '0'       XOR old_crc(02) XOR
    '0'       XOR old_crc(00) XOR '0';
crc10_32comb(6) <=
    '0'       XOR new_data(30) XOR '0'       XOR '0'       XOR
    XOR new_data(26) XOR new_data(25) XOR '0'       XOR
    '0'       XOR '0'       XOR '0'       XOR new_data(20) XOR
```

Listing 4: Optimized VHDL Implementation of a 10-bit CRC Generator Using 32 Data Bits

```
        '0'     XOR '0'     XOR new_data(17) XOR new_data(16) XOR
        new_data(15) XOR '0'     XOR '0'     XOR new_data(12) XOR
        '0'     XOR new_data(10) XOR '0'     XOR new_data(08) XOR
        '0'     XOR new_data(06) XOR new_data(05) XOR '0'     XOR
        '0'     XOR '0'     XOR '0'     XOR new_data(00) XOR
        old_crc(09) XOR '0'     XOR '0'     XOR '0'     XOR
        '0'     XOR old_crc(04) XOR old_crc(03) XOR '0'     XOR
        old_crc(01) XOR '0'     XOR '0';
crc10_32comb(5) <=
        new_data(31) XOR '0'     XOR '0'     XOR '0'     XOR
        new_data(27) XOR new_data(26) XOR '0'     XOR '0'     XOR
        '0'     XOR '0'     XOR new_data(21) XOR '0'     XOR
        '0'     XOR new_data(18) XOR new_data(17) XOR new_data(16) XOR
        '0'     XOR '0'     XOR new_data(13) XOR '0'     XOR
        new_data(11) XOR '0'     XOR new_data(09) XOR '0'     XOR
        new_data(07) XOR new_data(06) XOR '0'     XOR '0'     XOR
        '0'     XOR '0'     XOR new_data(01) XOR new_data(00) XOR
        old_crc(09) XOR old_crc(08) XOR '0'     XOR '0'     XOR
        '0'     XOR '0'     XOR old_crc(03) XOR old_crc(02) XOR
        '0'     XOR old_crc(00) XOR '0';
crc10_32comb(4) <=
        new_data(3 1) XOR new_data(30) XOR new_data(29) XOR '0'     XOR
        new_data(27) XOR '0'     XOR '0'     XOR '0'     XOR
        new_data(23) XOR new_data(22) XOR '0'     XOR '0'     XOR
        new_data(19) XOR new_data(18) XOR '0'     XOR new_data(16) XOR
        new_data(15) XOR new_data(14) XOR new_data(13) XOR new_data(12) XOR
        '0'     XOR new_data(10) XOR new_data(09) XOR '0'     XOR
        new_data(07) XOR '0'     XOR new_data(05) XOR new_data(04) XOR
        '0'     XOR '0'     XOR '0'     XOR new_data(00) XOR
        old_crc(09) XOR '0'     XOR '0'     XOR '0'     XOR
        old_crc(05) XOR old_crc(04) XOR '0'     XOR old_crc(02) XOR
        '0'     XOR old_crc(00) XOR '0';
crc10_32comb(3) <=
        '0'     XOR '0'     XOR new_data(29) XOR '0'     XOR
        '0'     XOR '0'     XOR '0'     XOR new_data(24) XOR
        '0'     XOR '0'     XOR '0'     XOR new_data(20) XOR
        new_data(19) XOR '0'     XOR '0'     XOR '0'     XOR
        '0'     XOR new_data(14) XOR '0'     XOR '0'     XOR
        new_data(11) XOR new_data(10) XOR new_data(09) XOR '0'     XOR
        '0'     XOR new_data(06) XOR '0'     XOR new_data(04) XOR
        '0'     XOR new_data(02) XOR '0'     XOR new_data(00) XOR
        old_crc(09) XOR '0'     XOR old_crc(07) XOR '0'     XOR
        old_crc(05) XOR '0'     XOR old_crc(03) XOR '0'     XOR
        '0'     XOR old_crc(00) XOR '0';
crc10_32comb(2) <=
        '0'     XOR new_data(30) XOR '0'     XOR '0'     XOR
        '0'     XOR '0'     XOR new_data(25) XOR '0'     XOR
        '0'     XOR '0'     XOR new_data(2 1) XOR new_data(20) XOR
        '0'     XOR '0'     XOR '0'     XOR '0'     XOR
        new_data(15) XOR '0'     XOR '0'     XOR new_data(12) XOR
        new_data(11) XOR new_data(10) XOR '0'     XOR '0'     XOR
        new_data(07) XOR '0'     XOR new_data(05) XOR '0'     XOR
        new_data(03) XOR '0'     XOR new_data(01) XOR new_data(00) XOR
        old_crc(09) XOR old_crc(08) XOR '0'     XOR old_crc(06) XOR
        '0'     XOR old_crc(04) XOR '0'     XOR old_crc(02) XOR
        '0'     XOR '0'     XOR '0';
crc10_32comb(1)<=
        new_data(31) XOR '0'     XOR '0'     XOR '0'     XOR
        '0'     XOR new_data(26) XOR '0'     XOR '0'     XOR
        '0'     XOR new_data(22) XOR new_data(21) XOR '0'     XOR
        '0'     XOR '0'     XOR '0'     XOR new_data(16) XOR
        '0'     XOR '0'     XOR new_data(13) XOR new_data(12) XOR
        new_data(11) XOR '0'     XOR XOR '0'     XOR new_data(08) XOR
        '0'     XOR new_data(06) XOR '0'     XOR new_data(04) XOR
        '0'     XOR new_data(02) XOR new_data(01) XOR '0'     XOR
        '0'     XOR old_crc(08) XOR old_crc(07) XOR '0'     XOR
        old_crc(05) XOR '0'     XOR old_crc(03) XOR '0'     XOR
        old_crc(01) XOR '0'     XOR '0';
crc10_32comb(O) <=
        new_data(31) XOR new_data(30) XOR new_data(29) XOR new_data(28) XOR
        new_data(27) XOR '0'     XOR '0'     XOR '0'     XOR
        '0'     XOR new_data(22) XOR '0'     XOR '0'     XOR
        '0'     XOR '0'     XOR '0'     XOR new_data(16) XOR
        new_data(15) XOR new_data(14) XOR '0'     XOR new_data(12) XOR
        '0'     XOR '0'     XOR '0'     XOR new_data(08) XOR
        new_data(07) XOR '0'     XOR '0'     XOR new_data(04) XOR
        new_data(03) XOR '0'     XOR new_data(O 1) XOR new_data(00) XOR
```

-continued

Listing 4: Optimized VHDL Implementation of a 10-bit CRC Generator Using 32 Data Bits

```
    old_crc(09) XOR old_crc(08) XOR '0'    XOR old_crc(06) XOR
    old_crc(05) XOR '0'    XOR '0'    XOR old_crc(02) XOR
    old_crc(01) XOR '0'    XOR '0';
end arc;
```

The CRC generator circuit as expressed in the VHDL code shown in Listing 4 above was synthesized using the same synthesis software as that of the code of Listing 3. The circuit utilizes a 10 ns clock and has the time constraint of generating a CRC result on 32 bits of input data within a single clock cycle, i.e. within 10 ns.

The synthesis of the circuit of Listing 4 meets the time requirements imposed by a 10 ns clock rate with an arrival time of 6.05 ns. for the output of the CRC results wherein an arrival time of 8.67 ns is required to meet the timing constraints imposed. This translates into a slack time of 2.62 ns, meaning the result arrives at the output of the circuit 2.62 ns before the required time.

This is in contrast to the arrival time of 21.11 ns. for the output of the CRC results of the prior art CRC generator code of Listing 3 wherein an arrival time of 8.72 ns. is required to meet the timing constraints imposed. This translates into a slack time of −12.39 ns., meaning the result arrives at the output of the circuit 12.39 ns. after the required time. Thus, the prior art CRC generator cannot meet the time requirements.

Another advantage of the method of the present invention is that the VHDL synthesized consumes a total cell area of 657 cell units, almost 30% less than the prior art code size. In addition, the run time to synthesize the optimized VHDL code of the present invention is approximately 1½ minutes, a time faster by a factor of four over the prior art code.

It is intended that the appended claims cover all such features and advantages of the invention that fall within the spirit and scope of the present invention. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention.

What is claimed is:

1. A method of generating high level circuit description language code representing a cyclic redundancy code (CRC) generator circuit, said CRC generator circuit adapted to implement a generator polynomial G(x), said method comprising the steps of:

generating remainder equations for all bits in said CRC generator in accordance with said generator polynomial G(x);

calculating in an iterative fashion remainder equations for all bits in said CRC generator for the $k^{th}$ data bit by substitution based on the remainder equations for the k−1 data bit;

counting the number of occurrences of each term in each remainder equation;

removing all occurrences of any term that occurs twice in a remainder equation;

repeating said steps of calculating, counting and removing for each of N data bits;

generating high level circuit description language code corresponding to the final set of remainder equations; and wherein N is a positive integer.

2. The method according to claim 1, wherein the high level circuit description language code generated is adapted to yield a CRC result for N data bits within a single clock cycle.

3. The method according to claim 1, wherein said method is implemented in software using the AWK test manipulation programming language.

4. The method according to claim 1, wherein said step of calculating comprises splitting said remainder equations into individual tokens.

5. The method according to claim 4, wherein said tokens comprise r0, r1, and so on up to the number of bits in said CRC generator.

6. The method according to claim 4, wherein said tokens comprise d0, d1, . . . , d(N−1).

7. The method according to claim 1, further comprising the step of inputting said high level circuit description language code generating into an appropriate synthesizer so as to realize said CRC generator circuit.

8. The method according to claim 1, further comprising the step of rebuilding said remainder equations without the terms removed.

9. The method according to claim 1, further comprising the step of rebuilding said remainder equations without the terms removed wherein remainder terms and data bit terms are grouped separately.

10. The method according to claim 1, further comprising the step of replacing terms that occur twice in a remainder equation, with zero.

11. The method according to claim 1, wherein N equals 32.

12. The method according to claim 1, wherein the length of said CRC generator equals 8 bits.

13. The method according to claim 1, wherein the length of said CRC generator equals 16 bits.

14. The method according to claim 1, wherein the length of said CRC generator equals 32 bits.

* * * * *